United States Patent [19]

Doucette

[11] 4,145,623

[45] Mar. 20, 1979

[54] CURRENT MODE LOGIC COMPATIBLE EMITTER FUNCTION TYPE LOGIC FAMILY

[75] Inventor: Richard L. Doucette, San Marcos, Calif.

[73] Assignee: Burroughs Corporation, Detroit, Mich.

[21] Appl. No.: 839,342

[22] Filed: Oct. 4, 1977

[51] Int. Cl.² .................. H03K 19/08; H03K 3/286
[52] U.S. Cl. ............................ 307/289; 307/203; 307/291; 307/299 A
[58] Field of Search ............ 307/289, 290, 291, 203, 307/299 A, 215, 218

[56] References Cited

U.S. PATENT DOCUMENTS 3,551,697  12/1970  Candy ........................ 307/289 X Primary Examiner—John Zazworsky
Attorney, Agent, or Firm—Joseph R. Dwyer; Mervyn L. Young; Kevin R. Peterson

[57] ABSTRACT

An EFL D-type latch having both true and complement output with a data input transistor and a bistable storage cell comprising first and second transistors, at least one of which is multi-emitter, connected such that the true output is connected to the collector of the first transistor of the storage cell and the complement output is connected to the collector of the data input transistor and the second transistor of the storage cell to take advantage of the phase inversion of the latter transistors depending upon which one of these transistors has current flowing therethrough. Also described is an EFL type complement output circuit connected as a D-type master-slave flip-flop, an RS latch, and a JK master-slave flip-flop using an RS master latch and a D-type slave latch. Also disclosed is a toggle flip-flop implemented with a D-type flip-flop to complete an EFL type logic family.

11 Claims, 11 Drawing Figures

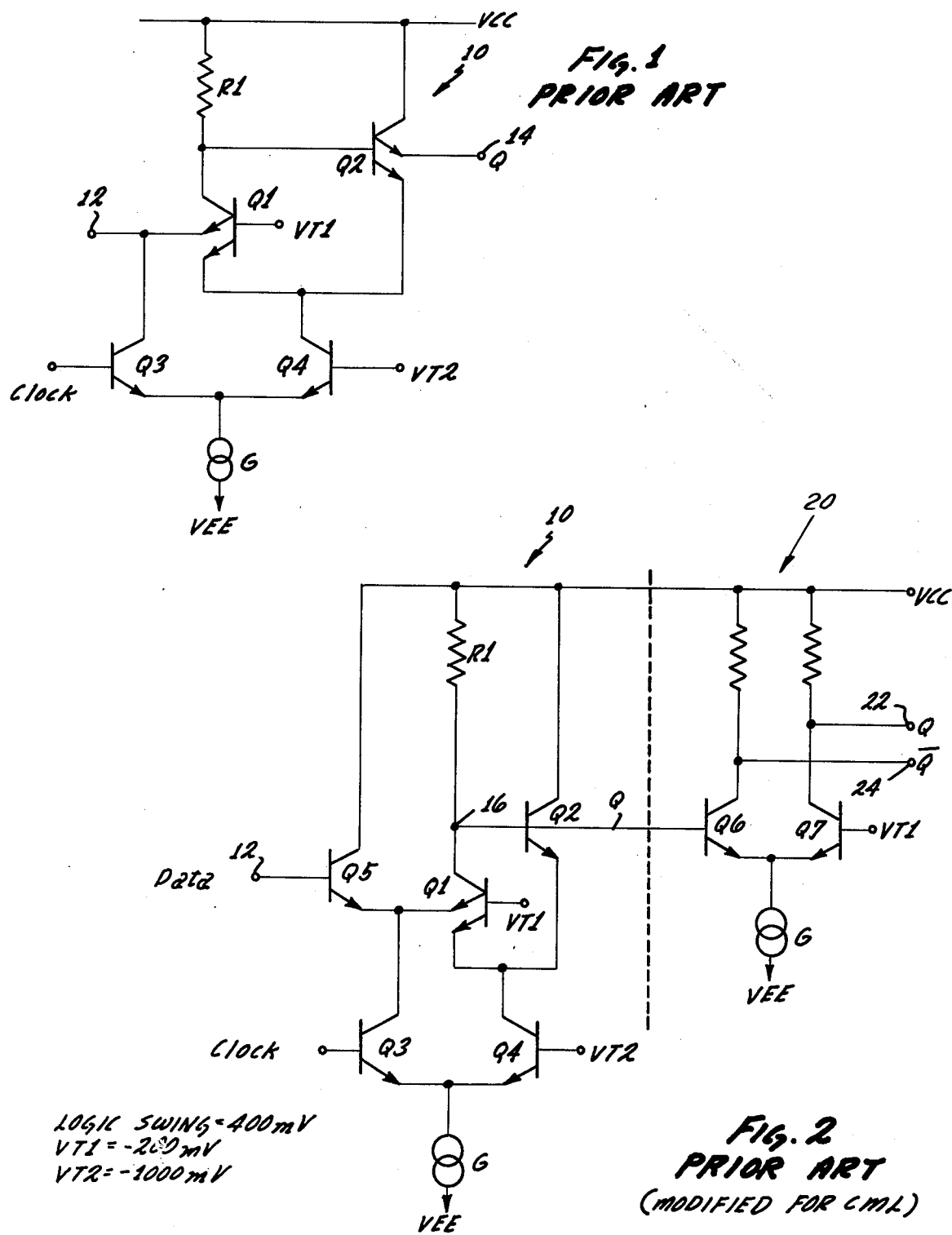

FIG. 6A
| tn | | tn+1 * |
|---|---|---|
| S | R | Q |
| L | L | NO CHANGE |
| L | H | L |
| H | L | H |
| H | H | H |
*NOTES:
tn = BIT TIME BEFORE CLOCK POSITIVE-GOING TRANSITION
tn+1 = BIT TIME AFTER CLOCK POSITIVE-GOING TRANSITION
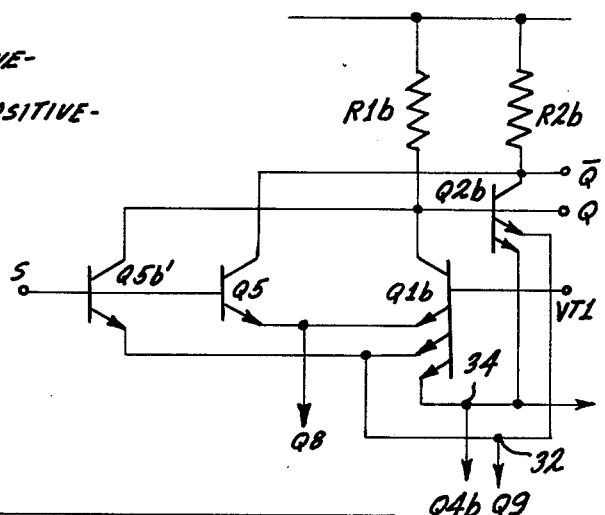
FIG. 6B
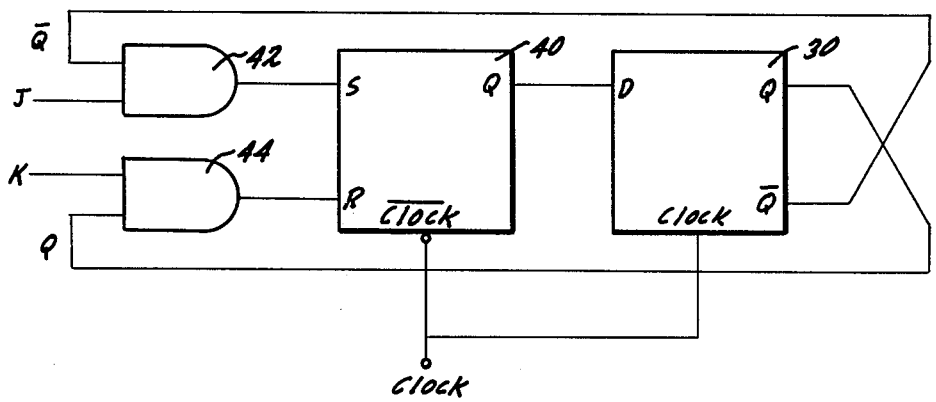
FIG. 7
FIG. 7A
| tn | | tn+1 * |
|---|---|---|
| J | K | Q |
| L | L | NO CHANGE |
| H | L | H |
| L | H | L |
| H | H | TOGGLE |
*NOTES:
tn = BIT TIME BEFORE CLOCK POSITIVE-GOING TRANSITION
tn+1 = BIT TIME AFTER CLOCK POSITIVE-GOING TRANSITION VT3=1800mV

CURRENT MODE LOGIC COMPATIBLE EMITTER FUNCTION TYPE LOGIC FAMILY

BACKGROUND OF THE INVENTION

Current Mode Logic (CML) gates or switching circuits for high speed digital systems having transistors operating out of saturation with relatively small voltage swings are well-known for their high speed response. With the development of Large Scale Integration (LSI) for fabricating a large number of components on a chip, there has also been developed a class of logic circuit configurations of a non-inverting type known as Emitter Function Logic (EFL) providing performance of most of the logic operations at the emitter of a multi-emitter bipolar transistor. These EFL non-inverting multi-emitter structures minimize power dissipation, operate at lower power supply voltage with less propagation delay and utilize less chip area while maintaining the advantage of CML. Two examples of EFL gates are described in the U.S. Pat. No. 3,795,822 to Z. E. Skokan dated Mar. 5, 1974 and entitled, Multi-Emitter Coupled Logic Gate, and are also described in a paper entitled, Emitter Function Logic-Family For LSI, by the inventor named in the foregoing patent and published by the IEEE Journal of Solid State Circuits pages 356–361, Oct. 1973.

As explained in the article, Skokan avoided using complement outputs from his EFL gates to speed up their operation; the idea being to avoid charging the base-collector capacitance of the input transistor to twice the value of input voltage swing rather than just one time the value. However, in so doing he lost the ability to create a number of other logic configurations, such as a toggle flip-flop or a JK flip-flop, since these require an inversion or a complement output which is fed back to the input. This loss of toggling ability especially limits the usefulness of the EFL gates since in most systems some kind of a toggle function is required.

Thus, while EFL gates are useful, some of the advantages of EFL are lost since the family of logic functions is limited without a complement output. The prior solution to this problem has been to connect the output of the EFL gate to a standard CML gate to obtain the complement output but the disadvantage of this is the extra gate delay from the output of the EFL gate through the CML gate. The CML gate also takes up extra chip area and consumes additional power.

It has been discovered, however, that an EFL type latch can be provided with a true and complement and be compatible with LSI technology without additional gates, and thus, additional logic building blocks to the Skokan logic family can be provided.

Stated another way, utilizing the teachings of this invention, a D-type latch with true and complement outputs, a D-type master-slave flip-flop with true and complement outputs, an RS latch and a JK flip-flop may be provided to complete the logic family of EFL with less loss of performance than would otherwise occur utilizing the teachings of the prior art.

SUMMARY OF THE INVENTION

The circuitry which overcomes the aforementioned deficiencies of the prior art comprises a modified EFL type latch having a data input transistor and a bistable storage cell with a first and second transistor. The true output is connected to the collector of the first transistor of a cell, a multi-emitter transistor, and the complement output is connected to the collector of the second transistor of the cell and to the data input transistor. Utilizing this arrangement an EFL type logic family is completed.

BRIEF DESCRIPTION OF THE DRAWINGS

FIG. 1 is a schematic diagram of a prior art EFL type logic device in the form of a gated latch;

FIG. 2 is a schematic diagram of an EFL gated latch modified so as to be coupled compatibly to a standard CML gate for producing true and complement outputs;

FIG. 6A is the truth table for the RS latch of FIG. 6;

FIG. 6B shows an alternative to the latch of FIG. 6 as a means of controlling dominate input transistors;

FIG. 7 shows the JK flip flop of FIG. 8 in symbolic logic;

FIG 7A is the truth table for the JK flip-flop of FIGS. 7 and 8; and

DESCRIPTION OF THE PREFERRED EMBODIMENT

Figure 3:
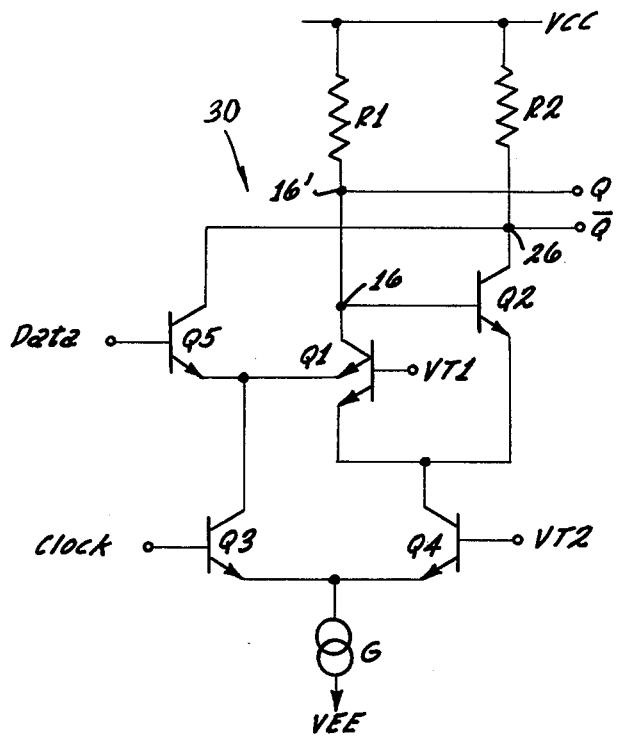
FIG. 3 is a schematic diagram of this invention wherein true and complement outputs are obtained from an EFL type logic device shown in the form of a gated D-type latch.

The invention herein disclosed and claimed can be better understood by a reference first to a standard prior art EFL latch, and accordingly, FIG. 1 shows a gated latch 10 of the EFL type having a pair of multi-emitter differentially connected NPN transistors Q1 and Q2; transistor Q1 forming the input stage and transistor Q2 forming the common collector current amplifier for the multi-emitter output. Data input node 12 is connected to one emitter of transistor Q1 to receive binary input signals (highs and lows) and the output Q at node 14 is taken off one emitter of transistor Q2. Another output emitter of transistor Q2 is connected back to a second emitter of transistor Q1 and the collector of transistor Q1 is connected to the base of transistor Q2. Both collectors of transistors Q1 and Q2, respectively, are connected to a referenced supply source VCC with resistor R1 interposed between VCC and node 16 which connects the collector of the transistor Q1 to the base of transistor Q2. The base of transistor Q1 is connected to a reference or threshold voltage VT1.

A current switch comprising a differentially connected NPN transistors Q3 and Q4 have their emitters connected in common through a constant current generator G, to a negative supply voltage Vee and their collectors connected, respectively, between node 12 and one emitter of transistor Q1 and the commonly connected emitters of Q1 and Q2. The current switch Q3, Q4 is connected to a single phase type clock with signal clock being shown connected to the base of transistor Q3 while the base of transistor Q4 is connected to a second threshold voltage VT2.

When a clock LOW state exists transistor Q3 is in an OFF condition and transistor Q4 is in an ON condition, current flows through either transistor Q1 or Q2 depending upon the state of the latch at the time the clock went low.

On the other hand, when the clock is HIGH and transistor Q3 is thus in an ON condition, the feedback connection, i.e., the emitter of transistor Q2 back to the emitter of transistor Q1, is disabled and the data input determines the state of the latch. Thus, the latch is considered transparent and the output Q at node 14 is HIGH or LOW depending on whether data input is HIGH or LOW.

Thus far described, latch 10 is similar to the latch described in the foregoing article by Skokan.

Turning now to FIG. 2 it can be seen in that there is also shown a gated latch 10 of the EFL type again operated by a single phase type clock with signal clock. For the sake of clarity, the same reference letters and numerals are used in this figure to denote similar functioning components as used in connection with FIG. 1. In this case, however, transistor Q2 is now a single emitter transistor and the true output Q is connected to the base thereof. Thus, transistors Q1 and Q2 form a bistable storage cell as in CML. Too, the data input node 12 is shown connected to the base of an additional (input) transistor Q5 whose emitter is connected in common to the data input emitter of Q1 and to the collector of transistor Q3, the latter forming the clock switch. Input transistor Q5 with the diode voltage drop across its base-emitter junction accommodate the EFL gate to CML logic swings of 400 mV. Also, typically, the threshold voltages are: VT1 = −200 mV and VT2 = −200 mV + a diode voltage drop = −1000 mV.

This latch responds to the clock signals in the same manner as the prior art switch described in connection with FIG. 1. It is to be noted, however, that the output from the EFL gate 10 is gated through a standard CML gate, indicated in its entirety as 20, as the aforesaid suggested prior method of obtaining the true and complement outputs Q and $\overline{Q}$ from the EFL device. In this circuit, the node 16 is connected to the base of transistor Q6 which is one of the differential pair of transistors Q6 and Q7. Typically of a CML gate, the collectors of the transistors Q6 and Q7 are connected to output nodes 22 and 24 with node 24 being the inverted or complement output of node 22 by reason of the inverting function of transistor Q6. Since the function and operation of CML gates are well known, no further description thereof is deemed necessary herein particularly since the purpose of this figure is only to show the prior art method of obtaining the true and complement outputs from an EFL gate.

As aforesaid, this known disadvantage of the standard EFL type gate is the lack of the complement output $\overline{Q}$ which complement heretofore could only be obtained by the introduction of an additional gate which, of course, introduces another delay in the operation of the device.

The purpose herein is to show how the complement $\overline{Q}$ can be obtained without an additional gate delay and turning now to FIG. 3 and the following description, it will be apparent that the complement output $\overline{Q}$ can be obtained by taking advantage of the phase inversion on the collector of the current amplifier Q2 of the EFL gate.

Again, the components with which are in common with the foregoing figures are given the same reference letters and numerals in this figure when they perform the same function in the following described circuit as they did in the circuits of the foregoing figures.

In this FIG. 3, latch 30 utilizes the bistable storage cell of FIG. 2 but with the true output Q connected at node 16' and to the collector of transistor Q1 on the same side as the resistor R1 as node 16 as above described. Also complement $\overline{Q}$ is connected at node 26 to the collector of transistor Q3 and to the collector of transistor Q5. An additional resistor R2 is introduced and located between node 26 and the voltage reference source VCC (R1 = R2 = 400 ohms, typically).

The single phase type clock switch comprising transistors Q3 and Q4 is the same as in FIG. 2. When the clock signal is HIGH and Q3 is turned ON output $\overline{Q}$ is derived through the inversion function of transistor Q5 and when the clock signal is LOW and transistor Q4 is in an ON condition with the current flowing through transistor Q1 or Q2 depending upon the state of the latch when the clock went LOW, the inversion or $\overline{Q}$ is derived through transistor Q2.

Thus, if the clock signal is HIGH, current will flow through transistor Q3 and through transistor Q5 or Q1 depending upon the state of the data input. If transistor Q5 is ON (data HIGH) current will flow through transistor Q5 from transistor Q3 and thus cause a voltage drop at node 26 rendering a $\overline{Q}$ LOW. Since transistor Q1 is in a OFF condition, the voltage at node 16' is the same as VCC so that Q, the true output is HIGH. On the other hand, if transistor Q5 is LOW (data input LOW), then current will flow through transistor Q1 from transistor Q3 rendering a voltage drop at node 16' causing the output Q to be LOW. Since the base of transistor Q5 is LOW, this transistor is in an OFF condition and the voltage at node 26 is HIGH. rendering $\overline{Q}$ HIGH; the complement of Q. The foregoing description is the so-called transparent mode of operation of the D type latch where the output Q will follow the data input.

On the other hand, if the clock signal is LOW, current will flow through transistor Q4 and transistors Q1 or Q2 depending upon their respective states at the time the clock signal went LOW. It is to be noted that with the clock signal being low, transistor Q3 is in an OFF condition so that regardless of the data input to transistor Q5, transistor Q5 is unable to change the state of the complement output $\overline{Q}$ nor the true output Q and thus the device is latched, i.e., regardless of the state of the data input, the state of the output of the latch will remain the same.

Figure 4:
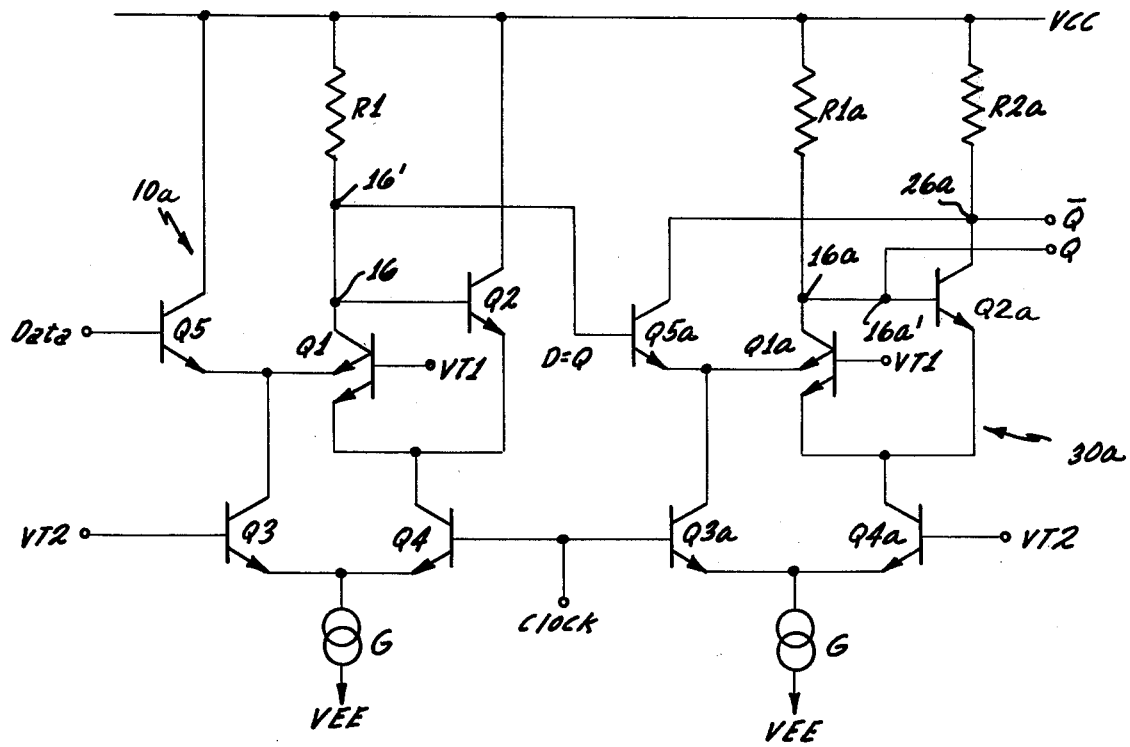
FIG. 4 illustrates two latches of the type as shown in FIG. 3 coupled to form a D-type master-slave flip-flop.

Turning now to FIG. 4, there is shown the gated latch 10a which corresponds to latch 10 of FIG. 2 with the output Q taken from node 16' and coupled to a gated latch 30a which corresponds to latch 30 of FIG. 3 in a master-slave configuration to form a D-type master-slave flip-flop. The use of this type of flip-flop for memory storage purposes and to prevent a race condition is well-known and forms an important logic building block for a complete EFL type logic family.

Again, in this Figure as in the prior figures, those components having the same function are given the same reference letters and numerals with the suffix "a" added to the letters and numerals to show the identical functions and operations of the components.

The flip-flop in this FIG. 4, each having its own current switching devices, is connected to a single phase clock which drives the base of the transistor Q3a and the base of transistor Q4, with the bases of transistors Q4a and transistors Q3 connected in common to a threshold voltage source VT2. In this configuration, when clock is LOW, the slave is latched and the master is transparent. When clock is HIGH, the slave is transparent and the master is latched.

Since the operation of the two latches is the same as previously described in connection with FIG. 3 except that the true or Q output is the data input to the slave latch, no further description is deemed necessary herein.

Figure 5:
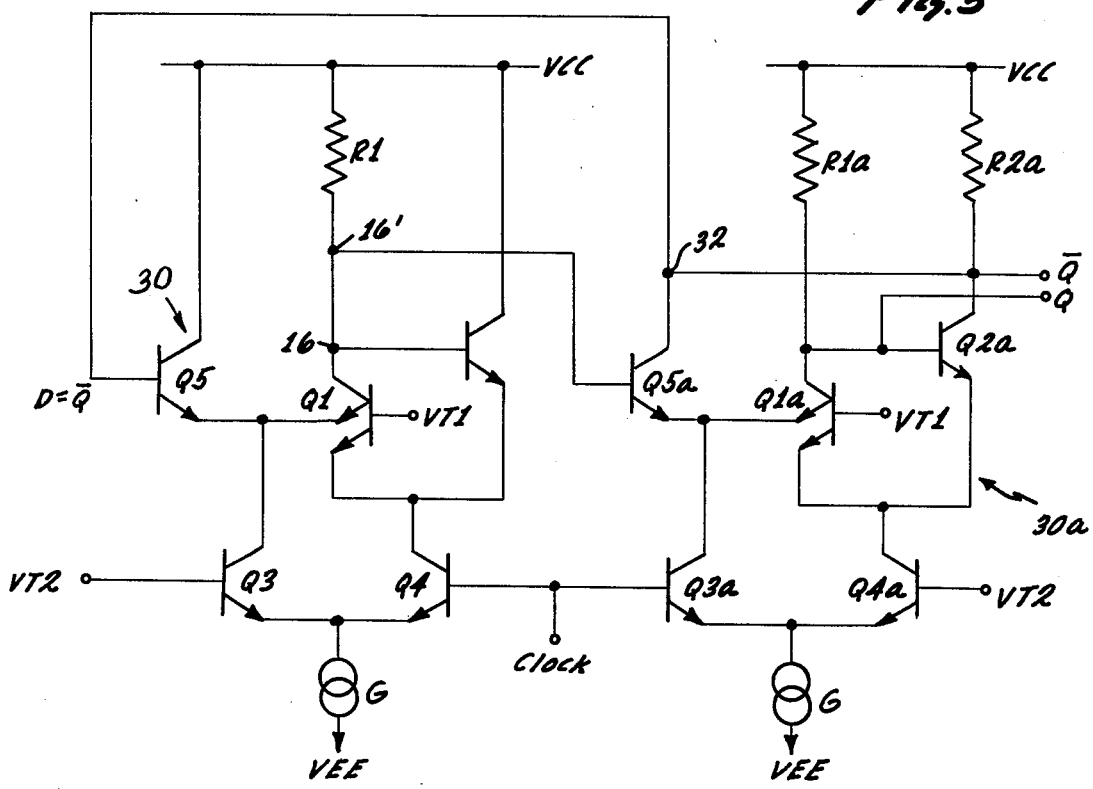
FIG. 5 illustrates the two latches of the type shown in FIGS. 3 and 4 coupled to form a toggle flip-flop.

Utilizing these same D-type master-slave latches of FIG. 3 connected again in master-slave configuration, FIG. 5 shows how a toggle flip-flop is formed. This figure, like FIG. 4, shows the two latches, 30 and 30a, having the same components and connected in the same way as described in connection with FIGS. 1 and 3, i.e., the input to the base of transistor Q5a is the true or Q output from the master latch 30. In addition, however, the $\overline{Q}$ output from the slave latch is connected at node 32 and fed back to the data input of the transistor Q5 of the master latch. In this configuration, the flip-flop is toggled and changes state with each change of the clock pulse in the conventional manner.

This configuration shows a common use of $\overline{Q}$, the complement output, and the advantage thereof in an EFL type gate configuration. To accomplish this according to the teachings of the prior art would have required an additional gate delay to derive the complement $\overline{Q}$ necessary to be fed back to the data input to form a toggle configuration.

Figure 6:
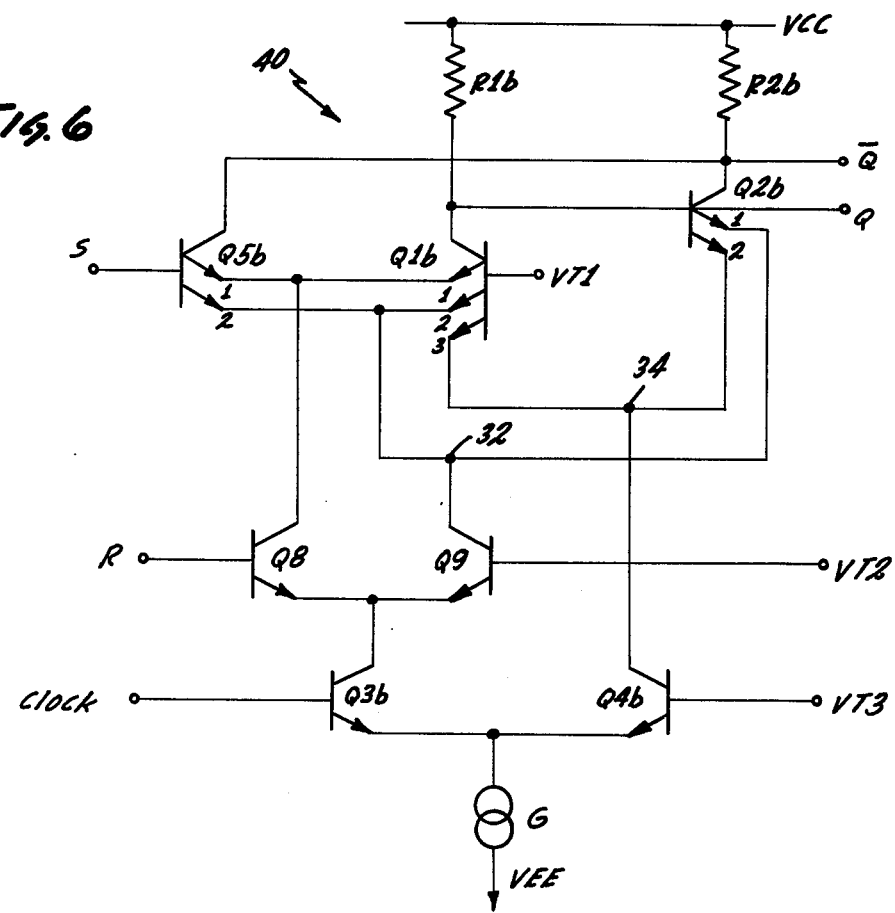
FIG. 6 is a schematic diagram of the invention in the form of an RS latch.

Turning now to FIG. 6, there is shown an RS latch 40 of the present invention formed by adding emitters to the transistors which correspond to the transistors Q5, Q1 and Q2 of the prior figure and by adding an additional differentially connected pair of transistors Q8 and Q9 to interrelate to the additional emitters of transistors Q5, Q1 and Q2. Again, the components which perform the same function in the latch as in the previous latches are given the same reference letters and numerals as in the previous latches but with a suffix "b" and, for the sake of clarity, some of the emitters are numbered. Thus, in this embodiment, transistors Q5b and Q2b have two emitters numbered 1 and 2, respectively, and transistor Q1b has three emitters identified as 1, 2 and 3. The S input to this latch is connected to the base of transistor Q5b and its two emitters 1 and 2 are connected in current steering relationship to emitters 1 and 2 of transistor Q1b while the latter's base is reference to a first voltage threshold reference VT1. Emitters numbered 1 of transistors Q5b and Q1b are connected in common to the collector of transistor Q8 of the differentially connected pair of transistors Q8 and Q9 while the base of transistor Q8 is connected to the second input R for this RS latch, and the base of transistor Q9 is connected to a second threshold voltage reference VT2. The emitters numbered 2 of transistor Q5b and Q1b are connected at node 32 first to the collector of transistor Q9 and to the number 1 emitter of transistor Q2b. The other emitter numbered 2 of transistor Q2b is connected at node 34 to the emitter number 3 of transistor Q1b, and to the collector of transistor Q4b, one of the pair of transistors Q3b and Q4b forming the clock switch. The base of transistor Q4b is connected to a third threshold voltage source VT3 (VT3 = −200 mV + two diode voltage drops = −1800 mV) while the base of transistor Q3b is connected to the clock signal source and their respective emitters are connected in common through a constant current generator G to a voltage source VEE. To complete the circuit, the collector of clock switch transistor Q3b is connected in common to the emitters of transistors Q8 and Q9.

As can be seen, the true output Q corresponds to the standard EFL type true output and, while the resistor R2b is shown, if the complement $\overline{Q}$ is not utilized, R2b would not be necessary. This corresponds to the description of the D-type master-slave flip-flop of FIG. 4 where the $\overline{Q}$ was not utilized in the D type master-slave latch therein described.

Now, as the operation of the RS flip-flop as described herein, when the clock signal is LOW and transistor Q3b is in its OFF condition, the flip-flop will remain in the state that it was before the clock went LOW. Thus, when the clock is LOW, current flows through transistor Q4b and then through either emitter 3 of transistor Q1b or emitter 2 of transistor Q2b. Now, when the clock signal goes HIGH and transistor Q3b is ON and transistor Q4b is OFF and both R and S inputs are LOW, current flows through transistor Q3b and through transistor Q9 and through either Q1b, emitter 2, or emitter 1 of transistor Q2b. Thus, when both inputs S and R are LOW, with the clock signal HIGH, the latch does not change the state and this is shown in the truth table, FIG. 6A.

Now, assuming that the input R is HIGH and the input S is LOW, then current flows through transistor Q3b as before, and through transistor Q8 since Q8 is in an ON condition with R being HIGH. Since transistor Q5b is OFF with its input being LOW, then current flows through emitter 1 of transistor Q1b causing a voltage drop in the collector of transistor Q1b pulling Q LOW. This is shown in the truth table FIG. 6A.

Now, if the input S is HIGH turning transistor Q5b ON and the input R is LOW turning transistor Q8 OFF, then the current flows through transistor Q3b, then through transistor Q9 because R is LOW and since Q5b is in an ON condition, current will flow through emitter number 2 of Q5b causing a voltage drop at the collector of Q5b pulling complement output $\overline{Q}$ LOW and at the same time Q is HIGH since Q1b is in an OFF condition and Q4b of the clock switch is also OFF.

In a still further condition with the inputs S and R both HIGH which normally is an unbalanced state, it can be seen from the truth table of FIG. 6A that the output will be HIGH. By way of explanation, if R is HIGH, current coming through transistor Q3b goes through transistor Q8 because R is HIGH and since S is also HIGH, current flows through Q5b, emitter 1. That forces complement output $\overline{Q}$ LOW and true output Q HIGH. This is an advantage in that it is usually desirable to have a flip-flop go into some state rather than into an invalid one, i.e., into a state in between a HIGH and LOW which a typical RS latch will do.

It is possible to have one signal, either R or S, dominate the other signal in the condition where the clock signal is HIGH and both inputs to S and R are HIGH and this is shown in FIG. 6B. This figure is similar to FIG. 6 except that transistor Q5b has been split into two transistors, Q5 and Q5b'. Thus, emitter number 1 of transistor Q5b of FIG. 6, now Q5, remains connected to emitter number 1 of Q1b but emitter number 2 of Q5b is now the single emitter from the transistor Q5b' and it is connected to the number 2 emitter of the transistor Q1b. Thus, if the collector of Q5 were connected to the collector of Q2b as shown, then S will override R or if the collector of Q5 were connected to the collector of Q1b then R will override S so that if both R and S were HIGH then the output would be LOW, thus actually eliminating the invalid state of the prior art RS latches.

While the foregoing teaches that it is impossible to have an invalid state with an EFL type RS gate, in common practice if the RS flip-flop is used as the master latch of a JK flip-flop, it is impossible for S and R to be HIGH at the same time. This is explained in connection with FIG. 7 which shows a JK flip-flop utilizing the RS latch 40 of FIG. 6 and a D-type latch 30 of FIG. 3 as the slave latch. It should be pointed out here that while normally the prior art master and slave flip-flops are the same, in this instance, it shows that an RS flip-flop may be used as a master and a D-type flip-flop as a slave to form a JK flip-flop. The advantage is in speed of operation since the capacitances involved in a D-type master-slave flip-flop are less (because of fewer emitters) than in the RS flip-flop utilizing more emitters.

To more clearly understand the circuitry of FIG. 8, attention is first directed to FIG. 7 which shows a JK flip-flop made up of an RS type latch 40 and a D-type latch 30 as described in connection with the previous figures but shown as logic symbols in this figure in a master-slave configuration. Added also are two typical CML AND gates, 42 and 44, and the clock is shown with one input inverted in this simplified version. According to the truth table as shown in FIG. 7A, the master-slave latches operate as a conventional JK flip-flop so no further description is deemed necessary.

It is to be noted that with the master-slave latches as shown in FIG. 7 utilizing the $\overline{Q}$ complement output from the slave latch 30, there is only one gate delay from output $\overline{Q}$ to the S above. The prior art method would require two gates and thus two gate delays in the operation of this JK flip-flop. This definitely increases the maximum frequency at which this flip-flop can operate.

Figure 8:
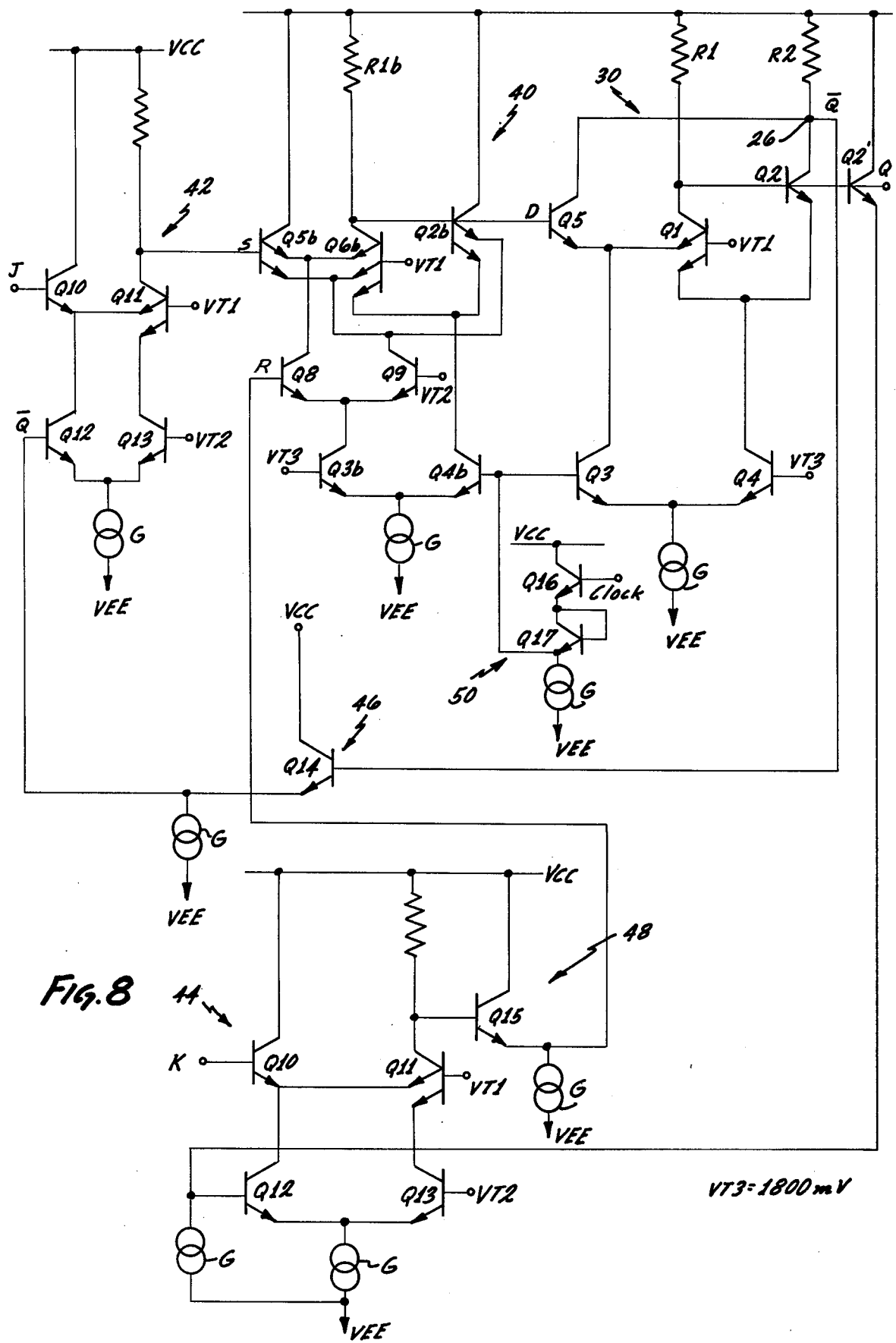
FIG. 8 illustrates two latches, one of the RS type of FIG. 6 and one of the D-type of FIG. 3, and also two logic gates coupled to form a JK master-slave flip-flop

In FIG. 8 the master latch 40 is identical to the latch described in connection with FIG. 6 and slave latch is identical to that described in connection with FIG. 3 so the same reference letters and numerals are used in FIG. 8 as are used in connection with the devices of FIGS. 3 and 6. In this figure it is to be noted that the true or Q output from the master latch 40 is connected to the data input of the D type latch at transistor Q5 and the single phase clock is connected between transistors Q4b of the master latch and Q3 of the slave latch while the bases of transistors Q3b of the master latch and transistor Q4 of the slave latch are referenced to a third threshold voltage VT3 (VT3 = −1800 mV). In addition, two typical CML AND gates, 42 and 44, are utilized as mentioned in the description of FIG. 7. One input to the AND gate 42 becomes the J input and one input to the second input to gate 44 become the K input. The second input to the first AND gate 42 is connected to the complement output $\overline{Q}$ of the slave latch 30 and the second AND gate 44 is connected to the true or Q output of the slave latch 30. Instead, however of a multi-emitter transistor for Q2 of the slave latch 30, transistor Q2 is separated into two transistors, Q2 and Q2′, with the second input to AND gate 44 connected to the emitter of Q2′ so that the true output Q is translated down one diode (emitter base junction of Q2′). Because this is a series gated relationship, a voltage translator 46 is located between the output $\overline{Q}$ of the slave latch 30 and the input $\overline{Q}$ of the gate 42 and, similarly, a voltage translator 48 is interposed between the output (collector of transistor Q11) from the second gate to the R input of the master-slave flip-flop. Too, a translator 50 is interposed between the clock input and the constant current generator G.

AND gate 42 is typically a series gated structure having an input transistor Q10 differentially connected to a current amplifying multi-emitter transistor Q11 with the base of transistor Q10 being the aforementioned J input and the base of Q11 connected to a first voltage threshold VT1. The emitter of transistor Q10 is connected to one of the two emitters of transistor Q11 and connected in common to the collector of transistor Q12 which is one of the pairs of transistors Q12 and Q13 differentially connected to form the second convert switch of the AND gate. The emitters of transistors Q12 and Q13 are connected in common to the voltage supply VEE through a constant current generator G, while the collector of transistor Q13 is connected to the second emitter of transistor Q11. As mentioned before, the second input of the AND gate 42, that is, the base of transistor Q12, is connected to the complement output $\overline{Q}$ of the D-type latch 30 at node 26 while the base of transistor Q13 is connected to a second threshold voltage VT2, and, to complete the circuit description, the collector of transistor Q11 is connected to VCC through a suitable collector resistor and the collector of transistor Q11 is also connected to the input to the RS latch 40, that is, the base of transistor Q5b.

The AND gate 44 is identical to the AND gate 42 so further description thereof is not deemed necessary. Again, since this is a series gated arrangement, voltage translators such as 46 and 48 are necessary. Typically, translator 46 comprises a transistor Q14 whose emitter is connected to the voltage supply VEE through a constant current generator G, and in this case, the base is connected to the complement output $\overline{Q}$ of latch 30 and its collector is connected to voltage supply VCC. It is noted that the complement $\overline{Q}$ for the input to the AND gate 42, being connected to the emitter of transistor Q14, is one diode lower, i.e., the voltage drop across the base-emitter junction of transistor Q14, to match the voltage drop through the first gate of the series gated AND gate 42. Similarly, the emitter of transistor Q15 of translator 48 of the second AND gate 44 is connected to the base of transistor Q8 the second input of the latch 40. Since the clock switches comprising transistors Q3, Q4 and Q3b, Q4b are also one gate below the second of the series gated relationship of the latch 40, voltage translator 50 is utilized. Voltage translator comprises two transistors Q16 and Q17 in series between VCC and the constant current generator G, with the clock being connected to the base of transistor Q16 and with the transistor Q17 being connected as a diode. Thus, there are two additional diodes between the node connecting the clock signal to the bases of Q4b and Q3. Since translators are well-known in the art, no further description is deemed necessary herein, but it might be well to point out that translators such as therein shown in this figure are also used in the previously described circuits where necessary. Again, with reference to the truth table of FIG. 7A and with the operation of latches 40 and 30 being previously described, the operation of the RS latch of this figure is evident.

From the foregoing, it can be seen that while the original EFL gates were directed to reducing the capacitances and thus increasing the speed of the gates, it also reduced the available logic units or building blocks for a data processing system. By adding a resistor and an input tranlator to the EFL gate as described in FIG. 3 and thus eliminating a gate delay for the complement output $\overline{Q}$, a JK master-slave flip-flop such as described in FIG. 7 and FIG. 8 can be used for a high speed counter utilizing only a typical current mode logic swings of 400 millivolts, as contrasted to the normal emitter couple logic 800 millivolt swings. Also, the ability to use the EFL configuration with a complement output without a loss of speed has been accomplished.

What is claimed is:

1. A latch circuit having means for connecting said latch circuit to a constant current source and a negative voltage supply and to a positive voltage supply comprising:
    a first gain element having a base, a collector, a plurality of emitters with its collector serving as a true output and with its base connected to a first threshold voltage reference;
    a second gain element having a base, a collector, at least one emitter connected in common to a first emitter of the first gain element with its collector serving as a complement output, and having its base connected to the collector of the first gain element;
    a third gain element having a base, a collector, and at least one emitter connected in common to a second emitter of said first gain element and with its base serving as an input and its collector connected in common to the collector of said second gain element to also serve as a complement output; and
    resistance means connected between said positive voltage supply and the common connector of the collectors of said second and third gain elements.

2. The latch circuit as claimed in claim 1, further including,
    clock switching means providing a current path through said third gain element or through said first gain element depending upon the input signal with reference to said first threshold voltage reference applied to the base of the third gain element.

3. The latch circuit as claimed in claim 2 wherein said clock switching means comprises a pair of differentially connected gain elements having commonly coupled emitters, the base of one of said elements serving as a clock input and the base of the other gain element connected to a second threshold voltage reference different from the first threshold voltage reference.

4. The latch circuit as claimed in claim 1 wherein said first, second and third gain elements each have an additional emitter, the additional emitter of the first gain element being connected in common to the additional emitter of the third gain element and to the additional emitter of said second gain element;
    a current switching device connected to the commonly connected first recited emitters of the first and third gain elements, and to the commonly connected additional emitters of the first and second gain elements; and
    a clock switch means connected between the current switching device and the commonly connected first recited emitters of the first and second gain elements.

5. The latch circuit in claim 4 wherein said current switching device comprises a pair of gain elements whose emitters are connected in common, with the base of one gain element forming the R input, and the base of the other gain element connected to a threshold voltage reference different from the first threshold voltage reference and wherein the base of the third gain element forms the S input of an RS latch.

6. The latch circuit as claimed in claim 1, in combination with the latch circuit of claim 4, wherein the latch circuit of claim 1 is connected in a master-slave configuration to form a JK flip-flop with the latch circuit of claim 4 being the master latch and the latch circuit of claim 1 being the slave latch, and
    wherein said master latch further includes said first, second and third gain elements each have an additional emitter, the additional emitter of the first gain element being connected in common to the additional emitter of the third gain element and to the additional emitter of the second gain element,
    a current switching device connected to the commonly connected first recited emitters of the first and third gain elements, and to the commonly connected additional emitters of the first and second gain elements, and
    a clock switch means connected between the current switching device and the commonly connected first recited emitters of the first and second gain elements;
    the true output of the master is connected to the input of the third gain element of the slave;
    a first AND gate and a second AND gate each having a first and second input means with the true output of the slave being connected to the second input means of said second AND gate and to the base of the first gain element of the current switching device of the master and the complement output of said slave being connected to the first input means of said first AND gate and to the base of the third gain element of said master; and
    wherein the other of said input means of said AND gates form JK inputs for the JK flip-flop.

7. The latch circuit as claimed in claim 6 wherein a clock signal source is connected to the master and to the slave with the connection of the clock source to the master being connected as an inverted input to the master.

8. A latch circuit as claimed in claim 1 further including a fourth gain element having a base, a collector, a plurality of emitters with its collector serving as the true output and with this base connected to said first threshold voltage reference;
    a fifth gain element having a base, a collector, at least one emitter connected in common to a first emitter of the fourth gain element with its collector serving as a complement output and having its base connected to the collector of the fourth gain element to also serve as the true output;
    a sixth gain element having a base, a collector, and at least one emitter connected in common to a second emitter of the fourth gain element and with its base serving as an input and connected to the collector of the first gain element and its collector connected in common to the collector of the fifth gain element to also serve as a complement output,
    resistance means connected between said positive voltage supply and the common connection of the collectors of said fourth and fifth gain elements, and
    clock switching means providing a current path through said third gain element or through said first gain element and through said sixth gain element or through said fourth gain element depending upon the input signal applied to the base of the third gain element with reference to said first threshold voltage reference.

9. The latch circuit as claimed in claim 8 wherein said clock switching means comprises pairs of differentially connected gain elements having commonly coupled emitters and with the bases of each pair being commonly coupled with said commonly coupled bases serving as a clock input and the bases of the other of the pair of differentially connected gain elements connected to a second threshold voltage reference different from the first threshold voltage reference.

10. The latch circuit as claimed in claim 9 wherein the collector of said sixth gain element is connected to the input of the third gain element.

11. An EFL type latch having both true and complement output including:

a data input NPN transistor having a collector, a base and at least one emitter, said base being connected to a data input source;

a bistable storage cell comprising first and second NPN transistors at least one of which is multi emitter, the emitter of the first transistor being connected in common with the emitter of the second transistor, with the collector of both said first and second transistors being connected through resistance means to a positive voltage source;

the emitter of said data input transistor being connected to an emitter of said first transistor and the collector being connected in common to the collector of said second transistor to form the complement output thus providing an output signal representative of the inverse of the data input signal applied to the base of the input transistor;

means connecting the collector of said first transistor to form the true output for providing an output signal representative of the data input signal applied to the base of the input transistor; and clock switching means connected to a constant current negative voltage supply for providing a current path through said input transistor or through the first and second transistors depending upon the input signal applied to the base of the input transistor.

* * * * *